United States Patent
Nilsson et al.

(10) Patent No.: US 9,063,408 B2
(45) Date of Patent: Jun. 23, 2015

(54) METHODS AND PROCESSES FOR MODIFYING POLYMER MATERIAL SURFACE INTERACTIONS

(75) Inventors: Jakob Nilsson, Lund (SE); Matthias Keil, Malmö (SE); Johan Ring, Malmö (SE); Babak Heidari, Furulund (SE)

(73) Assignee: Obducat AB, Malmo (SE)

( * ) Notice: Subject to any disclaimer, the term of this patent is extended or adjusted under 35 U.S.C. 154(b) by 770 days.

(21) Appl. No.: 12/635,329

(22) Filed: Dec. 10, 2009

(65) Prior Publication Data

US 2010/0160478 A1   Jun. 24, 2010

Related U.S. Application Data

(60) Provisional application No. 61/139,030, filed on Dec. 19, 2008.

(30) Foreign Application Priority Data

Dec. 19, 2008   (EP) .................................... 08172342

(51) Int. Cl.
*G03F 7/00*   (2006.01)
*G03F 7/038*   (2006.01)
(Continued)

(52) U.S. Cl.
CPC ............... *G03F 7/0002* (2013.01); *B82Y 10/00* (2013.01); *B82Y 40/00* (2013.01); *G03F 7/0048* (2013.01); *G03F 7/038* (2013.01)

(58) Field of Classification Search
CPC ....... G03F 7/0002; G03F 7/048; G03F 7/038; B82Y 10/00; B82Y 40/00; C08F 2/50
USPC .......................................... 522/170, 172, 182
See application file for complete search history.

(56) References Cited

U.S. PATENT DOCUMENTS 2,305,433 A    12/1942   Kyle
2,883,372 A     4/1959   Gelu
(Continued)

FOREIGN PATENT DOCUMENTS

DE    37 14011 A1    2/1988
EP    0 405 843 A2   1/1991
(Continued)

OTHER PUBLICATIONS

Copending U.S. Appl. No. 11/450,377, filed Jun. 12, 2006.
(Continued)

*Primary Examiner* — Michael Pepitone
*Assistant Examiner* — Jessica Roswell
(74) *Attorney, Agent, or Firm* — Renner, Otto, Boisselle & Sklar, LLP

(57) ABSTRACT

The invention to provide curable materials, comprising photo-reactive compounds, in particular, photoinitiators and polymerizable mono- or multifunctional monomers such as acrylates or epoxides. The material may also contain fluoro-surfactants completely or partly terminated by functional groups with the ability to bind covalently to said chemical composition under curing. The curable compositions are either purely acrylate based or a hybrid of different types of monomers such as acrylates, epoxides or vinyl ethers. The polymerizable monomers may cure with the use of different types of photoinitiator, such as free radical photoinitiators or cationic photoinitiators, ultimately forming a hybrid resist comprising interpenetrating networks of different types of monomers e.g. acrylates and epoxides. The acrylate/epoxide hybrid system has showed improved replication properties in terms of high nano-imprint lithography process fidelity, due to increased conversion of acrylates and low shrinkage.

5 Claims, 3 Drawing Sheets

Figure 1A:
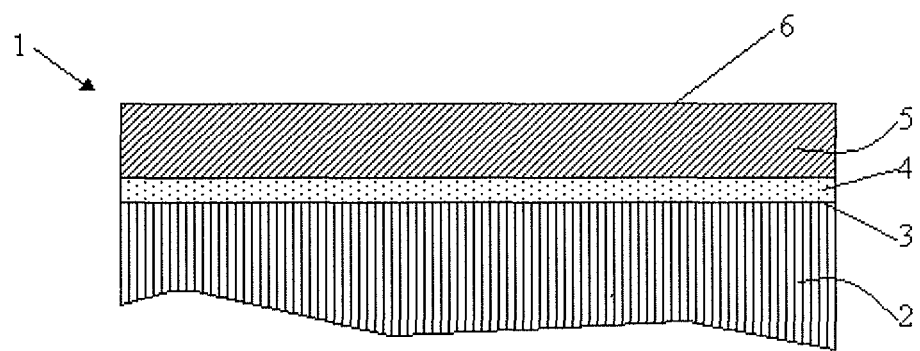

(51) Int. Cl.
*C08F 2/50* (2006.01)
*B82Y 10/00* (2011.01)
*B82Y 40/00* (2011.01)
*G03F 7/004* (2006.01)

(56) References Cited

U.S. PATENT DOCUMENTS

| | | | |
|---|---|---|---|
| 4,211,617 | A | 7/1980 | Hunyar |
| 5,334,424 | A | 8/1994 | Hani et al. |
| 5,459,213 | A | 10/1995 | Kelsey |
| 5,772,905 | A | 6/1998 | Chou |
| 6,334,960 | B1 | 1/2002 | Willson et al. |
| 6,705,853 | B1 | 3/2004 | Nehring |
| 6,939,664 | B2 | 9/2005 | Huang et al. |
| 6,953,332 | B1 | 10/2005 | Kurk et al. |
| 7,204,686 | B2 | 4/2007 | Chung et al. |
| 2001/0031802 | A1 | 10/2001 | Murschall et al. |
| 2002/0089088 | A1 | 7/2002 | Ils et al. |
| 2002/0092962 | A1 | 7/2002 | Domeier et al. |
| 2002/0160215 | A1 | 10/2002 | Peiffer et al. |
| 2003/0071016 | A1 | 4/2003 | Shih et al. |
| 2003/0159608 | A1 | 8/2003 | Heidari |
| 2003/0211297 | A1 | 11/2003 | Rossing et al. |
| 2003/0230817 | A1 | 12/2003 | Crook |
| 2004/0032063 | A1 | 2/2004 | Walther |
| 2004/0110856 | A1 | 6/2004 | Young et al. |
| 2004/0137734 | A1 | 7/2004 | Chou et al. |
| 2004/0170771 | A1 | 9/2004 | Bailey et al. |
| 2004/0183236 | A1 | 9/2004 | Ogino et al. |
| 2004/0219803 | A1 | 11/2004 | Staecker et al. |
| 2005/0082700 | A1 | 4/2005 | Deeman et al. |
| 2005/0084804 | A1 | 4/2005 | Truskett et al. |
| 2005/0146083 | A1 | 7/2005 | Olsson |
| 2005/0167047 | A1 | 8/2005 | Huff et al. |
| 2005/0191419 | A1 | 9/2005 | Helt |
| 2005/0208779 | A1 | 9/2005 | Klauk et al. |
| 2005/0224452 | A1* | 10/2005 | Spiess et al. ............... 216/41 |
| 2006/0110914 | A1 | 5/2006 | Gehoski et al. |
| 2007/0102844 | A1 | 5/2007 | Simon et al. |
| 2007/0272825 | A1 | 11/2007 | Xu et al. |
| 2007/0282466 | A1 | 12/2007 | Spindler et al. |
| 2008/0000373 | A1 | 1/2008 | Petrucci-Samija et al. |

FOREIGN PATENT DOCUMENTS

| | | |
|---|---|---|
| EP | 0 813 255 A1 | 12/1997 |
| EP | 1 127 912 A1 | 8/2001 |
| EP | 1 132 418 A1 | 9/2001 |
| EP | 1 160 775 A2 | 12/2001 |
| EP | 1 465 175 A1 | 10/2004 |
| EP | 1 533 657 A1 | 5/2005 |
| GB | 559072 | 2/1944 |
| GB | 637105 | 5/1950 |
| JP | 10-330577 | 12/1998 |
| JP | 2002-086463 | 3/2002 |
| JP | 2003272250 | 9/2003 |
| JP | 2008-515059 | 5/2008 |
| WO | 97/06468 | 2/1997 |
| WO | 01/42858 A1 | 6/2001 |
| WO | 01/70489 | 9/2001 |
| WO | 02/09894 | 2/2002 |
| WO | 03/031096 | 4/2003 |
| WO | 03/072625 | 9/2003 |
| WO | 2004/021083 | 3/2004 |
| WO | 2004/089546 | 10/2004 |
| WO | 2005/045524 | 5/2005 |
| WO | 2005/054948 | 6/2005 |
| WO | 2005/101466 A2 | 10/2005 |
| WO | 2005/109095 | 11/2005 |
| WO | 2005/119360 | 12/2005 |
| WO | 2006/131153 | 12/2006 |

OTHER PUBLICATIONS

Copending U.S. Appl. No. 11/268,574, filed Nov. 8, 2005.
Copending U.S. Appl. No. 11/305,157, filed Dec. 19, 2005.
J.Y. Shin el al., Chemical Structure and Physical Properties of Cyclic Olefin Copolymers, IUPAC Technical Report, Pure Appl. Chem., vol. 77, No. 5, pp. 801-814, 2005, DOI: 10.1351/pad200577050801.
T. Nielsen et al., "Nanoimprint lithography in the cyclic olefin copolymer, Topas®, a highly ultraviolet-transparent and chemically resistant thermoplast", Journal of Vacuum Science & Technology B: Microelectronics Processing and Phenomena, American Vacuum Society, new York, NY, US, vol. 22., No. 4. (Jul. 2004), pp. 1770-1775.
T. Nielsen et al., "Nanoimprint lithography in the cyclic olefin copolymer, Topas®, a highly UV-transparent and chemically resistant thermoplast", Journal of Vacuum Science & Technology, vol. 22., No. 4., Jul. 2004.
Decker, "UV-radiation curing chemistry", Pigment & Resin Technology, vol. 30, No. 5, 2001, pp. 278-286.
Decker et al.; "Photoinitiated Polymerization of Vinyl Ether and Acrylate Monomer Mixtures", J.M.S.—Pure Appl. Chem., vol. A34(4), 1997, pp. 605-625.
Vabrik el al.; "A Study of Epoxy Resin—Acrylated Polyurethane Semi-Interpenetrating Polymer Networks", Journal of Applied Polymer Science, vol. 68, 1998, pp. 111-119.
Choi et al., Fluorinated Organic-Inorganic Hybrid Mold as a New Stamp for Nanoimprint and Soft Lithography, American Chemical Society, vol. 21, No. 21, 2005, pp. 9390-9392.
Barbero et al., High Resolution Nanoimprinting with a Robust and Reusable Polymer Mold, Advanced Functional Materials, vol. 17, No. 14, 2007, pp. 2419-2425.
European Search Report dated Sep. 1, 2009 for corresponding European Patent Application No. 08172342.1.
European Search Report dated Apr. 15, 2009 for European Patent Application No. 08172338.9 corresponding to copending U.S. Appl. No. 12/635,296.
Chu et al., UV-Initiated Free Radical and Cationic Photopolymerizations of Acrylate/Epoxide and Acrylate/Vinyl Ether Hybrid Systems with and without Photosensitizer, Journal of Applied Polymer Science, vol. 93, 2004, pp. 1473-1483.

* cited by examiner

METHODS AND PROCESSES FOR MODIFYING POLYMER MATERIAL SURFACE INTERACTIONS

This application claims priority under 35 USC §119 (e) to U.S. Provisional Application No. 61/139,030 filed Dec. 19, 2008, and under 35 USC §119 (a) to European Application No. 08172342.1 filed on Dec. 19, 2008, the entire disclosures of which are incorporated herein by reference.

TECHNICAL FIELD OF INVENTION

The present invention relates to pattern replication in general and in particular to chemical and physical properties of the replicated material.

BACKGROUND OF THE INVENTION

One of the most powerful techniques for reproducing nano-structures—i.e. structures in the order of 100 nm or smaller—is nanoimprint lithography (NIL). In nanoimprint lithography an inverted copy of the surface pattern of a template—often called a stamp—is transferred into an object, comprising a substrate and, applied thereto, a film of a moldable layer often called resist, e.g. a polymer material. After heating the object to a temperature above the glass transition temperature of the polymer film, the stamp is pressed towards the film, cooled and released from the stamp—often called demolding—to give a polymer film with the desired pattern. This process is defined as a "thermal imprint process". Different thermal expansion coefficients of the imprinting materials may be devastating in a thermal imprint process where replication of micrometer and nanometer structures is required. Alternatively, a photo-resist material, i.e. a resin composition, which cures upon exposure to photon radiation, covers the substrate. This so-called "photon-imprint process" requires that either the substrate or the stamp is transparent. In a process subsequent to the imprint, the object—comprising the substrate and the patterned polymer film—can be post-processed, e.g. by etching of the substrate within the imprinted regions to transfer the pattern to a target surface of the substrate.

A method for transferring a pattern from a template to an object in an imprint process has been suggested, which involves a two-step process, which is described in JPA no. 2008-515059, U.S. patent application Ser. No. 11/450,377, U.S. patent application Ser. No. 11/268,574 and U.S. patent application Ser. No. 11/305,157.

The template or master used in an imprint process is generally a high cost product, and wear or damages to the template should therefore be minimized. The template may be made of any material, but is often made of Si, Ni, Ti, other metals, or quartz, optionally provided with an anti-stick layer. On the other hand, the object to be imprinted is often made of a relatively hard material, such as glass, quartz, a metal, silicon, or another semiconductor material, sometimes coated with different layers comprising metal, alloys, organic or carbonaceous materials. On their surfaces a comparatively soft moldable imprint layer is exposed. The imprinting of the object is a crucial moment, where parallel arrangement is important, and a very small residual layer of the moldable layer, often in the order of less than 10 nm, under the imprinted protruding structures is desired. Any non-parallel arrangement or excessive pressure may therefore cause damage to the template. By the suggested two-step imprint method, the template will only be used against a polymer material, which is softer than the template material, thereby minimizing the risk of damage.

One of the most crucial properties in the photon-based 2-step imprint process is the anti-sticking or anti-adhesion properties between both interfaces of 1) the original template and the IPS resist and 2) the cured and patterned IPS resist and the substrate resist.

SUMMARY OF THE INVENTION

A method for transferring a pattern from a template to an object in an imprint process has been suggested, which involves a two-step process involving curing with photon radiation. In the first step, a template with a structured surface is contacted with a polymer material to produce a flexible polymer replica having an inverse structured surface pattern of the template surface. Herein referred to as an intermediate polymer stamp (IPS). In the second step, the IPS is used as a second template. Here a substrate is coated with a moldable material and the IPS pattern is imprinted into the surface of the moldable material applied on the substrate. The so-produced pattern on the substrate is identical with the pattern of the original template. The invention offers a curable material for the IPS and the substrate, comprising photo-reactive compounds, in particular, photoinitiators and mono- and multi-functional acrylates, epoxides and vinyl ethers. The IPS material may also contain fluoro-surfactants siloxanes completely or partly terminated by chemical functionalities with the ability to covalently bind to the resist under curing. The invention provides curable materials for both the IPS and the substrate resist—either a purely acrylate based material or a hybrid material—developed for an easy industrial application and especially for improved replication fidelity. Ultimately, improved replication fidelity is achieved with the use of hybrid polymers comprising interpenetrating networks of different types of monomers e.g. acrylates and epoxides, which display a lower shrinkage and a higher conversion of the acrylate monomers, compared to purely acrylate-based resists. The latter property is important in order to avoid co-polymerization of the IPS and an acrylate-based substrate resists.

BRIEF DESCRIPTION OF THE TABLES AND FIGURES

Table 1:

Table 1 displays results from contact angles measurements for water, 1,5-pentanediol, diiodomethane and ethylene glycol provided on different surfaces.

Table 2:

Table 2 displays surface energies, together with their dispersion and polar contributions calculated from the contact angle results of table 1 applying the model of Owens, Wendt, Rabel and Kaelble. Additionally, the table contains the calculated work of adhesions and interface energies for different interfaces, calculated from the assorted surface energies contributions displayed in table 2.

FIG. 1 illustrates
  a) the different layers covering the polymer carrier object, and
  b) the different layers covering the substrate.

Figure 2:
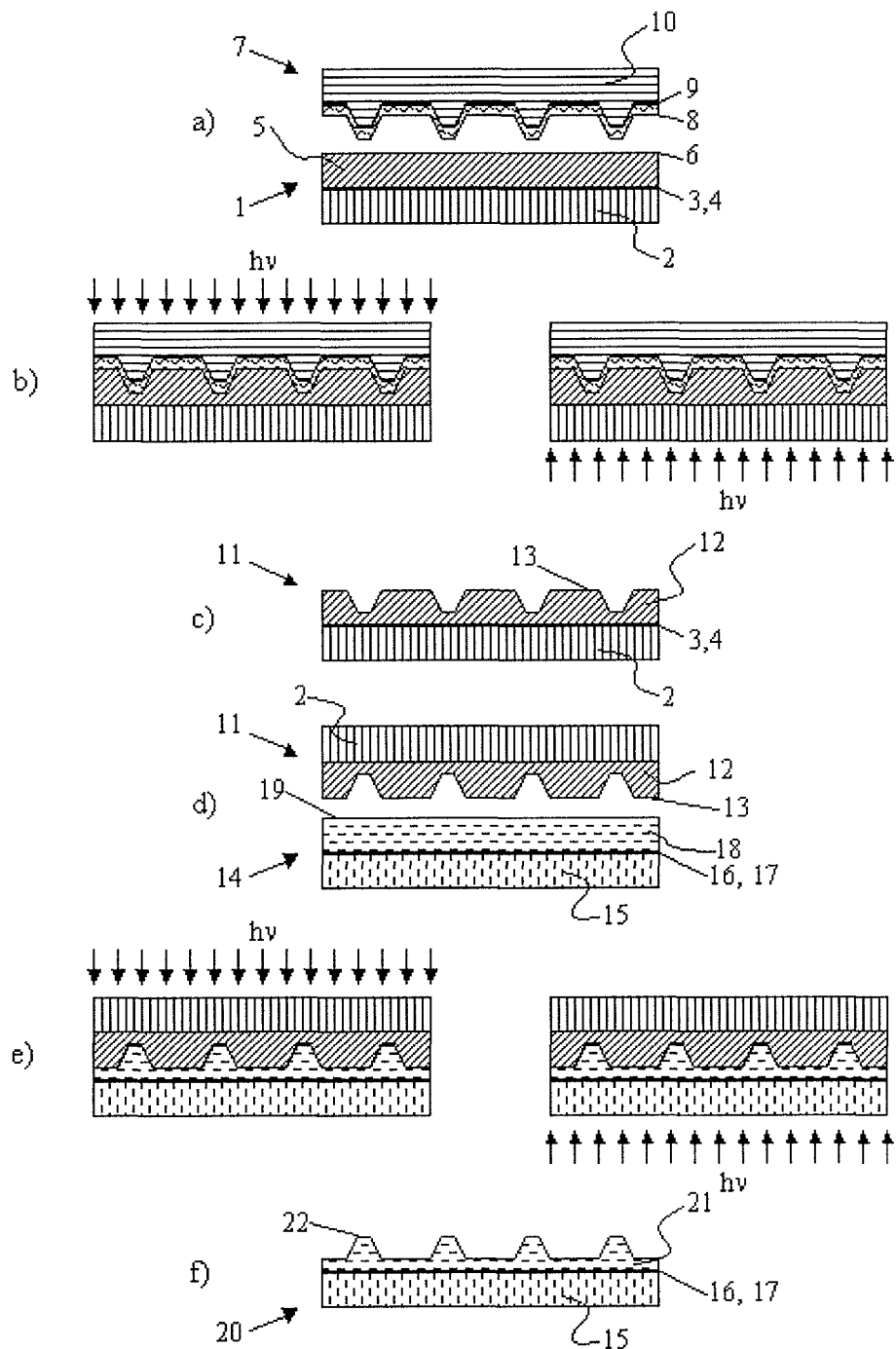

FIG. 2 schematically shows the UV based 2-step imprint process.

Figure 3:
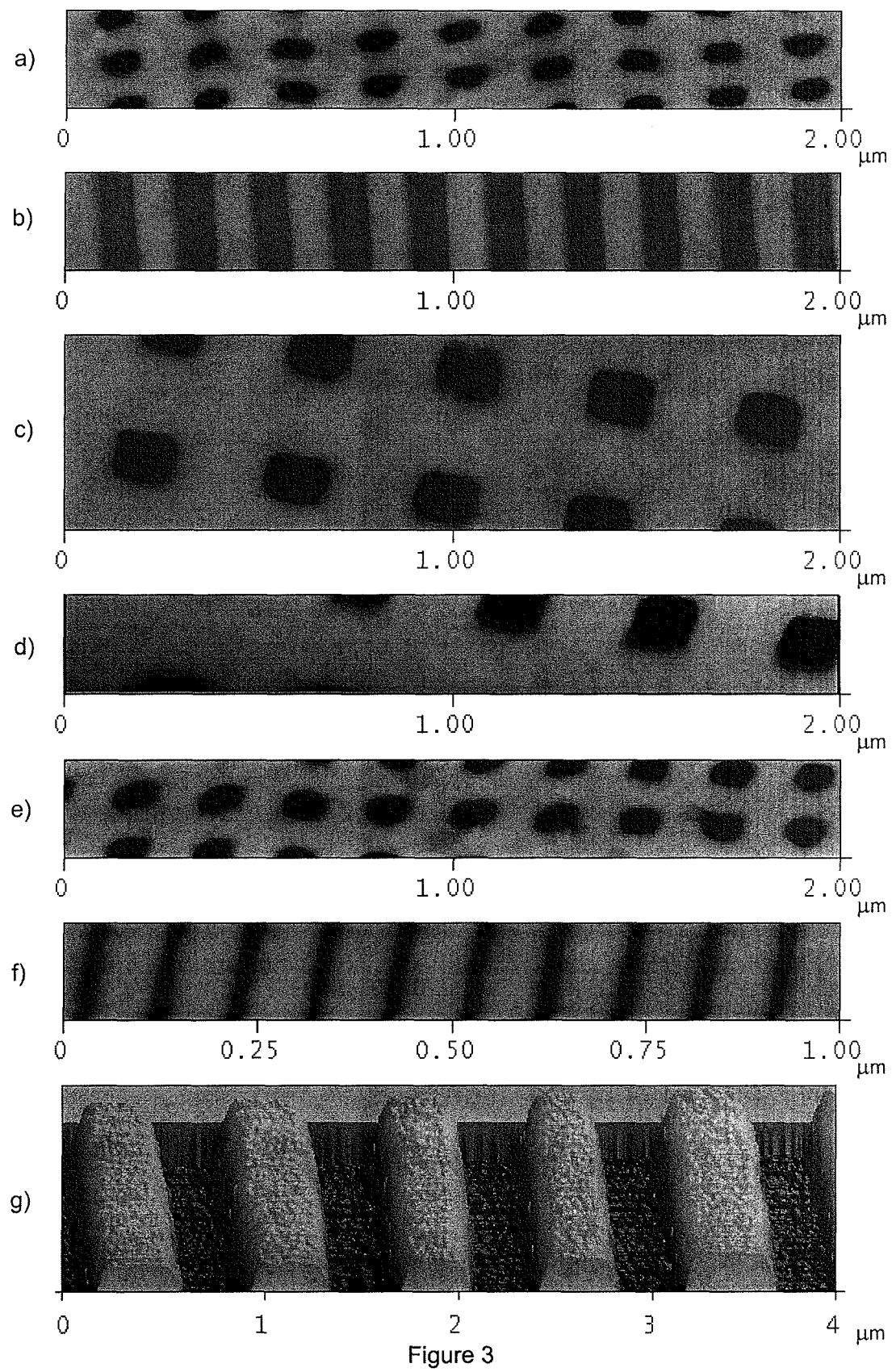

FIG. 3 displays AFM images of the substrate resist surfaces after performed imprints applying the UV-based 2-step imprint process. Stamps with various pattern sizes and the different IPS and substrate resist formulations have been applied.

DETAILED DESCRIPTION OF THE EMBODIMENT OF THE INVENTION

Anti-adhesion or adhesion at the interface between two different materials is strongly associated with the term surface energy or interface energy. The surface energy of a non-cured resist can be reduced significantly by the introduction of certain compounds e.g. fluoro-surfactants or siloxanes. Fluoro-surfactants phase segregates into a fluoro-surfactant poor and a fluoro-surfactant rich phase and the fluoro-surfactant rich phase is predominantly located close to the surface of the resist. After curing, the surfaces of fluoro-surfactant containing resists are characterized by low surface energies of 20 mJ/m² or lower, and large contact angles observed with different organic and inorganic solvents. Polysiloxane comprising materials are also characterized by relatively low surface energies.

Table 1 shows typical contact angles with water, 1,5-pentanediol, diiodomethane and ethylene glycol. Water contact angles higher than 100° could be observed for formulations after curing. Additionally, when the surface energy is divided into polar forces and dispersion forces, according to the model of Owens and Wendt, the surface energy $\gamma$ of the IPS is strongly dominated by the dispersion contribution $\gamma^d$ whereas the polar contribution $\gamma^p$ is very low due to the non-polarity of the fluoro-surfactants.

Table 2 presents some parameters which are important for the characterization of different surfaces or interfaces of the stamp/IPS, e.g. $\gamma$, $\gamma^d$, $\gamma^p$, $W_A$, $\gamma_{1,2}$. The different parameters have been calculated from contact angles measurements (table 1). As expected, the interfaces are characterized by low work of adhesions, $W_A$, of approx. 30 mJ/m² and low interface energies, $\gamma_{1,2}$ of almost 0 mJ/m² up to below 1 mJ/m². A low work of adhesion is very advantageous when a joint should exhibit low adhesion strength so that demolding can be performed easily. Low interface energies are found when the two surfaces establishing an interface are chemically very similar e.g. a joint consisting of two completely similar materials exhibits an interface energy of 0 mJ/m².

Formulations containing mixtures of different mono- or multi-functionalized monomers and/or oligomers, which after curing exhibits high degrees of cross-linking and low solubility, are applied as imprint materials. The acrylate-based resists are characterized by high reactivity and polymerize rapidly in the presence of photogenerated free radicals, in the absence of oxygen at ambient temperature. Acrylates are for many reasons attractive material, but generally suffer from drawbacks such as high oxygen sensitivity and large shrinkage upon polymerization. Cationic induced polymerization of epoxides and vinyl ethers is comparatively slow, but offers several advantages such as good mechanical properties of the resist, low shrinkage, and an oxygen insensitive process. The present innovation describes how material properties from different polymers may be combined by blending proper ratios of interpenetrating polymer networks (IPNs) forming a hybrid polymer system comprising for example both acrylates and epoxides epoxides [Vabrik et al]. The synthesis of IPNs can be achieved by photoinitiated polymerization of monomers, which polymerize through different mechanisms, typically photoinitiated free radial mechanism and photoinitiated cationic mechanism.

The developed IPS resist may be either a pure acrylate-based resist or a hybrid resist comprising both acrylates and epoxides. A high reactivity of the epoxy functionality is essential and obtained by the use of cyclic epoxides with a high intrinsic ring strain, such as the biscycloaliphatic epoxide with the following structure:

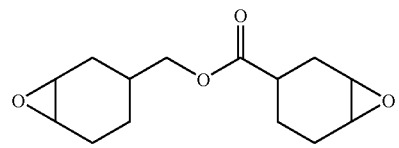 [SMILES: O=C(OCC1CCC2OC2C1)C1CCC2OC2C1]

Ring strains destabilize molecules due to a non-favourable high-energy spatial orientation of its atoms leading to a high curing rate and hereby circumvent the need of an additional thermal curing step. In spite of the high epoxide reactivity, acrylate- and epoxy-based hybrid resists are generally characterized by a fast curing of the acrylate monomers leading to a close to full conversion of the acrylates and lower conversions of the epoxides. A high conversion of the acrylates is essential if the substrate resist is acrylate based, as remaining acrylates present close to the surface of the IPS resist may participate in the polymerization process of the substrate resist leading to formation of covalent bonds between the IPS resist and the substrate resist.

Proper selection of both the photoinitiators and radiation wavelengths enables a sequential build-up of a hybrid IPNs [Decker], [Decker, Decker]. This refinement of the hybrid polymerization allows the synthesis of a highly cross-linked acrylate network, prior to the initiation of the epoxy network synthesis. This is achieved by exposing the non-cured IPS formulation to filtered radiation (wavelength >350 nm), absorbed solely by the free radical photoinitiator e.g. 2,4,6-trimethylbenzoylphenylphosphinate, but not by the cationic photoinitiator. In the second step the sample is exposed to unfiltered photon based radiation, which is absorbed by the cationic photoinitiator e.g. triarylsulfonium hexafluorophosphate, thus initiating polymerization of the epoxy monomers within the existing acrylate polymer network forming the IPNs. The sequential polymerization is here presented as a promising technique for the improvement of material properties such as reduced polymer shrinkage, due to the low shrinkage of the epoxides, and higher imprint fidelity etc.

An anti-sticking treatment of the IPS resist results in a low surface energy, which facilitates the release of the IPS resist and the substrate resist. In order to avoid surface treatment of the cured IPS resist it is advantageous if certain fluoro-surfactants or siloxanes are added to the mold material before curing. Especially, hydrophobic fluoro-surfactants molecule can be tailor-made to diffuse to the surface of the mold resist forming an anti-sticking layer. A common problem associated with this technique is that many fluoro-surfactants are only weakly non-covalently bound to the bulk material, which due to contaminations of the template stamp are less applicable in many NIL processes. The present innovation overcomes these problems by employing new fluoro-surfactants developed and optimized for the IPS resist/substrate resist imprinting technique as well as techniques developed for an efficient covalent attachment of the fluoro-surfactants previously used in a non-covalent mode.

Zonyl® FSO-100 is a fluorosurfactant, which consists of a perfluorinated alkyl chain block and an ethylene glycol block terminated with a free hydroxyl functionality. It is manufactured by DuPont and has the following structure:

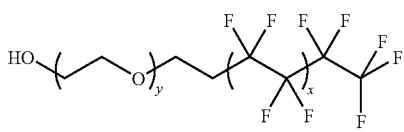

where x is an integer in a range of 0 to 7, inclusive; and y is an integer in a range of 0 to 15, inclusive.

Zonyl® FSO-100 has previously been employed in NIL applications only as a non-covalently attached anti-sticking agent. The terminal hydroxyl group of the fluorosurfactant is proposed to participate in the cationic polymerisation of an epoxide or vinyl ether monomer functioning as a chain transfer agent according to the mechanism illustrated below:

Photoinitiation

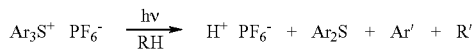

Chain transfer

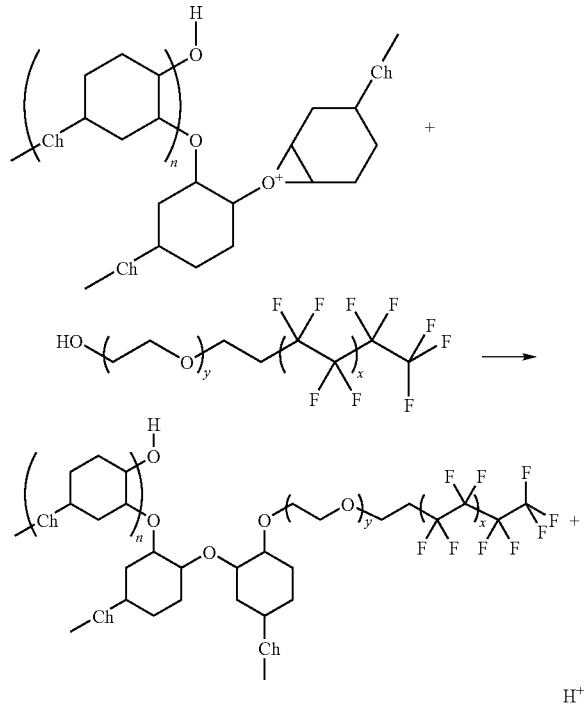

The Zonyl® FSO-100 molecule can hence be covalently attached to highly reactive epoxides or vinyl ethers, but generally not to other types of monomers polymerizable at room temperature, such as acrylates. Another related fluoro-surfactant suitable for covalent linkage to the IPS resist is the acrylic ester of Zonyl® FSO 100 with the following structure:

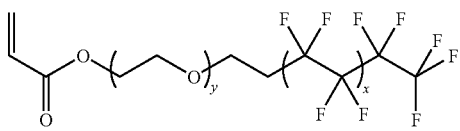

Acrylic ester of zonyl FSO 100 where x is an integer in a range of 0 to 7, inclusive; and y is an integer in a range of 0 to 15, inclusive. The acrylic ester of Zonyl® FSO 100 was prepared by treatment of Zonyl® FSO 100 with acryloyl chloride according to the procedure described in the experimental section and it may be employed as fluoro-surfactants in the IPS formulation.

One class of molecules that has showed strong potential as efficient fluoro-surfactants with the ability to diffuse to the surface of the mold resist forming an anti-sticking layer, are perfluoropolyether (PFPE) based derivatives end terminated with one or several chemical functionalities, such as acrylates. For example, the PFPE backbone has been linked to the acrylates via linear or branched aliphatic urethane block copolymers chain and is manufactured, which has the following structure:

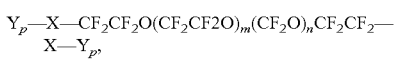

where X is an aliphatic urethane building block, Y is a (meth) acrylate and p equals one or two. The molecular weight of the PFPE part of the co-polymer is 1500-2000 g/mol and the ratio m/n is 1.5 to 2.5.

Substrate Resist

The substrate resist may be a purely acrylate based resist, or a hybrid resist of acrylates and vinyl ethers with material properties combined from the two types of polymers. A hybrid comprising acrylate and vinyl ether will consist of both a copolymerized acrylate and vinyl ether network formed upon radical polymerization and a vinyl ether network formed upon cationic polymerization. The networks formed in the acrylate/vinyl ether hybrid will compared to the acrylate/epoxide hybrid be covalently linked to a much higher degree, due to the ability of the vinyl ether to undergo both free radical and cationic polymerization [Decker, Decker]. The substrate resist may contain various acryloxy-functionalized siloxanes. These are free radical polymerizable siloxanes typically prepared by silanization of hydroxyl-terminated polydimethylsiloxanes with various acryloxysilanes, such as 3-methacryloxypropyldimethylchlorosilane exemplified by the scheme below:

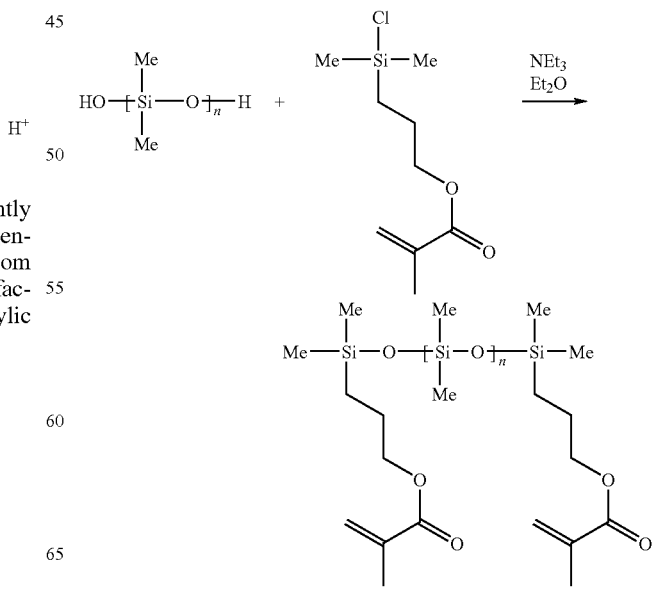

where n is approximately 7. The synthesis of acryloxy-functionalized siloxanes is described in several patents (e.g. U.S. Pat. No. 4,675,346) and a few acryloxy-functionalized siloxanes are also commercially available. Functionalized siloxanes may also be synthesised utilizing a transition-metal catalyzed hydrosilation of a hydrogen-terminated polydimethylsiloxanes and an olefin (e.g. U.S. Pat. No. 6,828,404 B2) In order to minimize the interface energy, the functionalized polydimethylsiloxanes are likely to diffuse to the surface/interface of the substrate resist and the IPS resist. Decreased work of adhesion and low concentration of reactive acrylates close to the surface functionalities are believed to aid the demolding process. A similar decrease in work of adhesion may also be achieved by the addition of other acryloxysilanes to the non-cured substrate resist, e.g. methacryloxypropyltris(trimethylsiloxy)silane with the following structure:

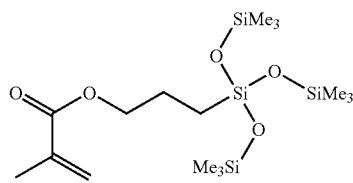 [SMILES: C=C(C)C(=O)OCCC[Si](O[Si](C)(C)C)(O[Si](C)(C)C)O[Si](C)(C)C]

The addition of silanes to the non-cured substrate resist will also improve the etch resistivity of the substrate resist.

One of the primary objectives of this invention was to ease the demolding process by adjusting the surface energy of both the IPS resist and substrate resist and minimize the chemical interactions in the interface of the IPS and substrate resist. Consequently, the imprint may also be successful if a formulation originally designed as a substrate resist is employed as an IPS resist together with a substrate resist based upon a formulation originally designed as an IPS resist. However, only the IPS resist formulation may contain fluoro-surfactants while both the substrate resist and the IPS may contain functionalized siloxanes.

Experimental

Acrylic Ester of Zonyl® FSO 100

An acrylic ester of Zonyl® FSO 100 was prepared from hydroxyl chain terminated fluorinated Zonyl® FSO 100 ($M_w$~725 g/mol, with $(CF_2CF_2)_x$, n~4 and $(CH_2CH_2O)_y$, n~8 from $^{19}F$ and $^1H$ NMR analysis) [Perrier et al]. To a solution of Zonyl® FSO 100 (5.0 grams, 6.9 mmol) and acryloyl chloride (0.75 grams, 8.3 mmol) in 30 mL of dichloromethane in was added triethylamine (0.3 mL) and the mixture was stirred for 4 h at 0° C. and then heated to ambient temperature and stirred for another 12 h. To the reaction was added 50 mL of ethyl acetate and the mixture was extracted twice with 30 mL of a saturated aqueous solution of $NaHCO_3$. The organic layer was dried over $MgSO_4$ and concentrated under reduced pressure to give the acrylic Zonyl® FSO 100 ester as a yellow oil (yield=90%). $^1H$ NMR (400 MHz, $CDCl_3$): δ 6.43 ppm (1H, dd, $CH_2$=CH—), 6.15 ppm (1H, dd, $CH_2$=CH—), 5.83 ppm (1H, dd, $CH_2$=CH—), 4.31 ppm (2H, m, —COO—$CH_2$—), 3.6-3.8 ppm (32H, m, O—$CH_2$—$CH_2$—O), 2.43 ppm (2H, m, $CH_2$—$CF_2$—).

Substrate Resist

The substrate resist may be a purely acrylate based resist, or a hybrid resist, with material properties combined from the two types of polymers, comprising acrylates and vinyl ethers, or acrylates and epoxides.

IPS Resist Composition 1

Composition 1 (referred to as "IPS50") is a purely acrylate-based IPS formulation containing approximately 0.25% by weight of the fluoro-surfactant Y—X—$CF_2CF_2O(CF_2CF_2O)_m(CF_2O)_nCF_2CF_2$—X—Y, where X is a short linear urethane block copolymers chain and Y is a methacrylate group.

IPS Resist Composition 2

Composition 2 (referred to as "IPS70/95") is an acrylate/epoxide-hybrid IPS formulation containing approximately 1% of Zonyl® FSO 100 derivatives by weight.

IPS Resist Composition 3

Composition 3 (referred to as "IPS105") is an acrylate/epoxide-hybrid IPS formulation containing approximately 1')/0 by weight of the fluoro-surfactant $Y_2$—X—$CF_2CF_2O(CF_2CF_2O)_m(CF_2O)_nCF_2CF_2$—X—$Y_2$, where X is a long branched urethane block copolymers chain and Y is an acrylate group.

IPS Resist Composition 4

Composition 4 (referred to as "IPS110") is an acrylate/epoxide-hybrid IPS formulation containing approximately 0.8% by weight of the fluoro-surfactant $Y_2$—X—$CF_2CF_2O(CF_2CF_2O)_m(CF_2O)_nCF_2CF_2$—X—$Y_2$, where X is a long branched urethane block copolymers chain and Y is an acrylate group, 0.6% of the acrylic ester of Zonyl® FSO 100 by weight.

IPS Resist Composition 5

Composition 5 (referred to as "IPS102") is a purely acrylate-based IPS formulation containing approximately 1% by weight of the fluoro-surfactant $Y_2$—X—$CF_2CF_2O(CF_2CF_2O)_m(CF_2O)_nCF_2CF_2$—X—$Y_2$, where X is a long branched urethane block copolymers chain and Y is an acrylate group.

Substrate Resist Composition 1

Substrate resist 1 (referred to as "SR20/47") is a purely acrylate-based substrate resist formulation without functionalized siloxanes.

Substrate Resist Compositions 2

Substrate resist 2 compositions (referred to as "SR02") are purely acrylate-based substrates resist formulations containing functionalized siloxanes.

Substrate Resist Compositions 3

Substrate resist 3 compositions (referred to as "SR35") are purely acrylate-based substrates resist formulations containing functionalized siloxanes.

Figure 1B:
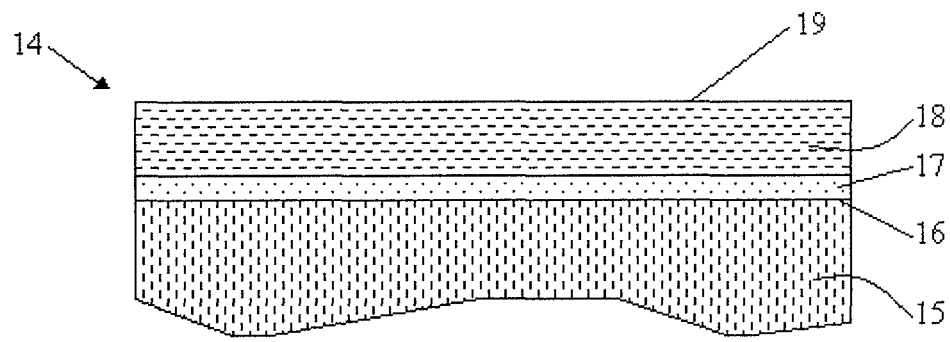

Description of the Process:

The two material assemblies 1 and 14 as displayed in FIGS. 1a and 1b, respectively, can be regarded as the essential prerequisite to succeed the two-step process illustrated in FIG. 2. Here, the first step is illustrated in FIGS. 2a-2c and the second step in FIGS. 2d-2f. In FIG. 2a the stamp or template 10, composed of materials such as silicon, quartz, nickel or other metals, an alloy or possibly a polymer material, has a patterned surface 9, comprising ribs, grooves, protrusions or recesses, having heights and widths in the order of micrometers or nanometers. The template surface 9 is normally, but not exclusively, equipped with an anti-adhesion layer 8. The template 10 is placed with the surface of the anti-adhesion layer 8 contacting a surface 6 of the specimen 1. A pressure of 1-40 bars is applied pressing the template 10 and the specimen 1 together. Resist 5 will fill the cavities of the template surface 9 and in order to minimize the interface energy of the interface between the template anti-sticking layer 8 and the resist surface 6, fluoro-surfactants will predominately assemble close to the surface 6.

The sandwich arrangement—comprising a template 10 equipped with an anti-sticking layer 8, a polymer carrier object 2, and photo-polymerizable resist 5 and possibly an adhesion promoter 4—is irradiated with photons either through the backside of the template 10 or through the polymer carrier object 2 as displayed in FIG. 2b). In the first case the template has to be transparent, whereas in the second case the polymer carrier object has to fulfill this requirement.

Curing produces a solidified, low-surface-energy replica, having a pattern inversed to that of the original template. The template 10 is separated or demolded from the flexible polymer replica 11 leaving a relief image on the surface 13 of the solidified polymer film 12, coated on the polymer carrier object 2 as displayed in FIG. 2c. After demolding neither plastic deformations of patterns of the surface 13 can be observed nor resist rip-off, e.g. residuals of resist 12 on template 10. The flexible polymer replica 11 herein is referred to as an intermediate polymer stamp (IPS).

In the second step of the two-step process, the pattern of surface 13 on IPS 11 is transferred to a target substrate as illustrated in FIGS. 2d)-2f). Here, surface 13 will be placed in contact with surface 19 of object 14 comprising a substrate 15 with surface 16 covered by a thin moldable layer 18 of a non-cured photo curable resist. A thin organic layer 17 acting as an adhesion promoter might be placed in-between the substrate surface 16 and the resist 18.

As illustrated in FIG. 2e with the help of an applied pressure lying between 1 to 40 bars the IPS 11 and object 14 will be forced together and cured with photon radiation. After demolding an inversion of the pattern on the surface 13 of the IPS 11 has been formed in the surface 22 of the layer 21, as shown in FIG. 2f.

EXAMPLES

Several IPS and substrate resist formulations have been evaluated, fulfilling necessary requirements as materials for an improved imprint process, showing high replication fidelity, and which are industrially easy and suitable to employ. The different formulations may be applied within the 2-step process—schematically described in FIG. 2—without further anti-sticking treatment of the IPS surface (13 in FIG. 2c or 2d), and thus avoids the need of external processes, such a plasma treatment, and/or a coating with an additional thin film.

Five Selected examples of Ni stamps or templates displaying patterns as small as sub 100 nm range were covered by a thin anti-sticking film—as described in Japanese patent no. 3892460 in 2006- and applied for the imprint tests as well a contact angle measurements described hereunder:

Table 1 displays contact angles for water, 1,5-pentanediol, diiodomethane and ethylene glycol applied to different surfaces. All measurements were carried out with a Tracker instrument from Teclis. The studied surfaces may be divided into three different categories:

1) Row 1 and row 2 display data for a hydrophobic anti-sticked Ni template or stamp (surface 8 of FIG. 2a).

2) Row 3 to row 7 display contact angles of the different IPS resists IPS102, IPS105, IPS110, IPS50 and IPS70/95 prepared by spin-coating the different formulations onto silicon wafers, pretreated with adhesion promoters, such as 3-(trimethoxysilyl)propyl methacrylate. The resulting film thicknesses were measured to be 600-1200 nm. Due to the presence of fluoro-surfactants, the surfaces display a pronounced hydrophobicity after curing.

Row 8 to row 10 display contact angles for the substrate resist SR35, SR02, and SR20/47, prepared by spin-coating onto silicon wafers, pretreated with adhesion promoters, such as 3-(trimethoxysilyl)propyl methacrylate. The resulting film thicknesses are approximately 70 nm for SR02; and 600 nm for SR35 and SR20/47. The contact angles observed for the surfaces of the cured non-fluorinated substrate resists (rows 8-10) are significantly lower than those observed for the surfaces of the fluorinated IPS resists (rows 3-7).

With the help of the contact angles displayed in Table 1 the surface energies, together with their dispersion and polar contributions have been calculated utilizing the model of Owens, Wendt, Rabel and Kaelble. The different values are displayed in table 2 columns 2 and 4. Additionally, the calculated work of adhesions and interface energies for different interfaces, calculated from the assorted surface energies contributions, are displayed in table 2, column 5. The calculated parameters should represent the following interfaces, divided in five groups:

Group 1:

Group 1 displays parameters characterizing the surfaces of the original Ni template, several cured-IPS resist compositions, and their interfaces (corresponding to surfaces 8 of FIG. 2a and the surfaces 6 of FIGS. 1a and 2a after curing). The patterned Ni stamp surface is characterized by low surface energy dominated by the dispersion contribution $\gamma^d$.

Groups 2-5:

The parameters displayed in groups 2 to 5 stand for the interfaces of several IPS resist compositions and several substrate resist compositions. Each group represents the interfaces of one IPS resist to one or two substrates resists. The values represents the surfaces and interfaces between the surface 13 of FIGS. 2c and 2d and the surface 19 of FIGS. 1b and 2d after curing. The calculated surface energies of the substrate resists are significantly larger than those of the surfactant containing IPS resists.

Example 1

A 1.5 µm thick film of the IPS resists IPS70/95 was spin-coated onto a polycarbonate film having a thickness of 125 µm. A 2-step imprint process was carried out according to FIG. 2. The anti-sticking treated Ni stamp 1 was pressed against the polymer film for 60 sec with a pressure of 30 bars, the resist was cured with photon radiation for 90 sec as illustrated in FIG. 2b. During the exposure time the applied pressure was kept at 30 bars. Afterwards, the Ni stamp was separated from the cured IPS. The IPS comprising a polycarbonate film equipped with a completely cured IPS resist was applied in the second imprint process (FIG. 2d). A SR02 substrate resist was spin-coated to a thickness of 50 nm onto a silicon wafer, pretreated with an 3-(trimethoxysilyl) propyl acrylate employed as an adhesion promoter for improved adhesion. The second imprint was performed as described above with a photon radiation time of 30 sec (FIG. 2e). After demolding, the cured substrate resist was examined by AFM. FIG. 3a displays an image of the substrate resist surface (surface 22 in FIG. 2f) with dimensions of the applied Ni stamp pattern given in the caption of FIG. 3a.

Example 2

An imprint with Ni Stamp 2 was performed according to the description of Example 1 using a 1 μm thick SR20/47 film as substrate resist in the second imprint step and—in the second imprint step—with a photon radiation time of 60 sec. FIG. 3b displays an image of the substrate resist surface with dimensions of the applied Ni stamp pattern given in the caption of FIG. 3b.

Example 3

An imprint with Ni Stamp 3 was performed according to the description of Example 1. However, the applied substrate resist (SR02) was 70 nm thick. FIG. 3c displays an image of the substrate resist surface with dimensions of the applied Ni stamp pattern given in the caption of FIG. 3c.

Example 4

An imprint with Ni Stamp 3 was performed according to the description of Example 3 using a 1 μm thick IPS110 film as an IPS resist in the first imprint step. FIG. 3d displays an image of the substrate resist surface with dimensions of the applied Ni stamp pattern given in the caption of FIG. 3d.

Example 5

An imprint with Ni Stamp 1 was performed according to the description of Example 1 using a 1.5 μm thick IPS105 film as an IPS resist in the first imprint step. FIG. 3e displays an image of the substrate resist surface with dimensions of the applied Ni stamp pattern given in the caption of FIG. 3e.

Example 6

An imprint with Ni Stamp 4 exhibiting a smaller structure sizes, was performed according to the description of Example 5. FIG. 3f displays an image of the substrate resist surface with dimensions of the applied Ni stamp pattern given in the caption of FIG. 3f.

Example 7

An imprint with Ni Stamp 5, exhibiting a larger pattern, was performed according to the description of Example 1 using a 1.5 μm thick IPS50 film as IPS in the first imprint step and a 1 μm thick SR20/47 film as substrate resist in the second imprint step and an with a photon radiation time of 60 sec in both imprint steps. FIG. 3g displays an image of the substrate resist surface with dimensions of the applied Ni stamp pattern given in the caption of FIG. 3g.

TABLE 1

|   | | water [°] | 1,5-pentane diol [°] | Diiodo-methane [°] | Ethylene Glycol [°] |
|---|---|---|---|---|---|
| 1 | Ni stamp patterned | 107.6 | 87.5 | 92.5 | — |
| 2 | Ni stamp non-patterned | 106.3 | 81.4 | 87.7 | — |
| 3 | IPS102 | 104.2 | 86.1 | 79.0 | — |
| 4 | IPS105 | 105.1 | 86.5 | 86.2 | — |
| 5 | IPS110 | 105.4 | 83.5 | 89.7 | — |
| 6 | IPS50 | 100.7 | — | 78.8 | 88.1 |
| 7 | IPS70/95 | 100.2 | — | — | — |
| 8 | SR35 | 82.0 | 67.4 | 72.1 | — |
| 9 | SR02 | 85.3 | 57.0 | 57.6 | — |
| 10 | SR20/47 | 79.1 | 54.3 | 47.1 | — |

TABLE 2

| Column 1: Template | | Column 2: Surface energy of the template | | | Column 3: Replica | Column 4: Surface energy of the replica | | | Column 5: Interface parameters | |
|---|---|---|---|---|---|---|---|---|---|---|
| Group | Template | $\gamma$ [mJ/m$^2$] | $\gamma^d$ [mJ/m$^2$] | $\gamma^p$ [mJ/m$^2$] | Replica | $\gamma$ [mJ/m$^2$] | $\gamma^d$ [mJ/m$^2$] | $\gamma^p$ [mJ/m$^2$] | $W_A$ [mJ/m$^2$] | $\gamma_{1,2}$ [mJ/m$^2$] |
| Group 1 | Ni stamp patterned | 13.14 | 11.37 | 1.77 | IPS102 | 19.18 | 18.03 | 1.15 | 31.50 | 0.83 |
|  |  |  |  |  | IPS105 | 16.09 | 14.44 | 1.65 | 29.04 | 0.19 |
|  |  |  |  |  | IPS110 | 14.77 | 12.82 | 1.95 | 27.86 | 0.05 |
| Group 2 | IPS102 | 19.18 | 18.03 | 1.15 | SR35 | 29.30 | 21.69 | 7.61 | 45.47 | 3.01 |
|  |  |  |  |  | SR02 | 33.69 | 29.95 | 3.74 | 50.63 | 2.25 |
| Group 3 | IPS105 | 16.09 | 14.44 | 1.65 | SR35 | 29.30 | 21.69 | 7.61 | 42.48 | 2.91 |
|  |  |  |  |  | SR02 | 33.69 | 29.95 | 3.74 | 46.56 | 3.22 |
| Group 4 | IPS110 | 14.77 | 12.82 | 1.95 | SR35 | 29.30 | 21.69 | 7.61 | 41.10 | 3.01 |
|  |  |  |  |  | SR02 | 33.69 | 29.95 | 3.74 | 44.95 | 3.87 |
| Group 5 | IPS15 | 20.15 | 18.13 | 2.02 | SR20/47 | 36.25 | 31.64 | 4.61 | 54.00 | 2.40 |

REFERENCES

[Adamson, Gast] A. W. Adamson and A. P. Gast "*Physical Chemistry of Surfaces*", John Wiley & Sons, Inc., New York, Sixth Edition, 1997.

[Decker] C. Decker, "UV-radiation curing chemistry", *Pigment & Resin Technology*, Vol 30(5), 2001, pp 278-286.

[Decker, Decker] C. Decker, D. Decker, "Photoinitiated polymerization of vinyl ether and acrylate monomer mixtures", *J.M.S.-Pure Appl. Chem.*, Vol A34(4), 1997, pp 605-625.

[Hiemenz, Rajagopalan] P. C. Hiemenz and R. Rajagopalan, "*Principles of Colloid and Surface Chemistry*", Marcel Dekker, Inc., New York, Third Edition, 1997.

[Perrier et al] S. Perrier, S. G. Jackson, D. M. Haddleton, B. Ameduri, B. Boutevin, *Tetrahedron*, Vol 58, 2002, pp 4053-4059; S. Perrier, S. G. Jackson, D. M. Haddleton, B. Ameduri, B. Boutevin, *macromolecules*, Vol 36, 2003, pp 9042-9047.

[Pocius] A. V. Pocius "*Adhesion and Adhesive Technology*", Hanser Publishers, Munich, Second Edition, 2002.

[Vabrik et al] R. Vabrik, I. Czajlik, G. Tury, I. Rusznak, A. Ille, A. Vig, "A study of epoxy resin-acrylated polyurethane semi-interpenetrating polymer networks", *Journal of applied polymer science*, Vol 68, 1998, pp 111-119.

The invention claimed is:

1. A process for making an intermediate polymer stamp (IPS), the intermediate polymer stamp applicable for use in a two-step imprint method in which a pattern is transferred from a patterned template to the intermediate polymer stamp and from the intermediate stamp onto the surface of a substrate resist, the process comprising:
    providing a photocurable composition comprising:
        at least one polymerizable mono- or multi-functional acrylate;
        at least one epoxide;
        at least one free radical photoinitiator and at least one cationic photoinitiator; and
        at least one fluorosurfactant having a hydroxy or acrylate terminal group;
    coating the photocurable composition onto a flexible substrate to form a photocurable polymeric film;
    transferring a pattern from the patterned template to the surface of the photocurable polymeric film by pressing the patterned template into the surface of the photocurable polymeric film, wherein the patterned template is not surface treated with an anti-adhesion layer;
    sequentially exposing the photocurable composition to radiation of a first wavelength and a second wavelength to cure the photocurable polymeric film, wherein the photocurable composition forms a hybrid material comprising interpenetrating networks of polymerized acrylates and epoxides upon photocuring; and
    removing the template from the cured polymeric film to produce a flexible intermediate polymer stamp having a low surface energy.

2. The process of claim 1, wherein the fluorosurfactant comprises a perfluoropolyether co-polymer with the structure: $Y_p$—X—$CF_2CF_2O(CF_2CF_2O)_m(CF_2O)_nCF_2CF_2$—X—$Y_p$, where X is an aliphatic urethane block, Y is an acrylate or a methacrylate, m and n are integers, and p equals 1, 2 or 3, with a molecular weight of the perfluoropolyether part of the co-polymer of 800-2500 g/mol.

3. The process of claim 1, wherein the fluorosurfactant comprises an acrylic ester with the following structure:

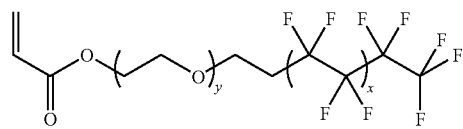

where x is an integer in a range of 0 to 6, inclusive; and y is an integer in a range of 0 to 15, inclusive.

4. The process of claim 1, wherein the work of adhesion of the intermediate polymer stamp/substrate resist interface is smaller than 65 mJ/m$^2$ and the interface energy of the intermediate polymer stamp/substrate resist interface is larger than 1 mJ/m$^2$.

5. The process of claim 1, wherein said intermediate polymer stamp is used in Nano Imprint Lithography applications.

* * * * *